US012685154B2

(12) United States Patent
Lee et al.

(10) Patent No.: US 12,685,154 B2
(45) Date of Patent: Jul. 14, 2026

(54) SEMICONDUCTOR PACKAGE

(71) Applicant: Samsung Electronics Co., Ltd.,
Suwon-si (KR)

(72) Inventors: Jonggyu Lee, Suwon-si (KR);
Jaechoon Kim, Suwon-si (KR);
Taehwan Kim, Suwon-si (KR);
Hwanjoo Park, Suwon-si (KR)

(73) Assignee: Samsung Electronics Co., Ltd.,
Suwon-si (KR)

( * ) Notice: Subject to any disclaimer, the term of this
patent is extended or adjusted under 35
U.S.C. 154(b) by 377 days.

(21) Appl. No.: 18/454,217

(22) Filed: Aug. 23, 2023

(65) Prior Publication Data

US 2024/0079366 A1 Mar. 7, 2024

(30) Foreign Application Priority Data

Sep. 7, 2022 (KR) ........................ 10-2022-0113574

(51) Int. Cl.
*H10W 40/10* (2026.01)
*H10W 90/00* (2026.01)
*H10W 72/00* (2026.01)
*H10W 72/30* (2026.01)
*H10W 74/15* (2026.01)
(Continued)

(52) U.S. Cl.
CPC ........... *H10W 40/10* (2026.01); *H10W 90/00*
(2026.01); *H10W 72/07351* (2026.01); *H10W*
*72/07355* (2026.01); *H10W 72/357* (2026.01);
*H10W 72/365* (2026.01); *H10W 72/367*
(2026.01); *H10W 72/877* (2026.01); *H10W*

*74/15* (2026.01); *H10W 76/60* (2026.01);
*H10W 76/63* (2026.01); *H10W 76/67*
(2026.01);
(Continued)

(58) Field of Classification Search
CPC ......... H01L 23/36; H01L 24/16; H01L 24/73;
H10W 40/10; H10W 90/00; H10W
72/07351; H10W 72/07355; H10W
72/357; H10W 72/365; H10W 72/367;
H10W 72/877; H10W 74/15; H10W
76/60; H10W 76/63; H10W 76/67
See application file for complete search history.

(56) References Cited

U.S. PATENT DOCUMENTS 8,907,472 B2    12/2014 Hung
9,428,680 B2 *  8/2016 Zambova ................. C08K 3/08
(Continued)

*Primary Examiner* — Ratisha Mehta
(74) *Attorney, Agent, or Firm* — Wolf, Greenfield &
Sacks, P.C.

(57) ABSTRACT

A semiconductor package includes a package substrate, a
semiconductor chip on the package substrate and having a
first surface facing the package substrate and a second
surface, opposite to the first surface, an encapsulant disposed
on the package substrate and on a side surface of the
semiconductor chip, a heat dissipation member on the semi-
conductor chip and spaced apart from the semiconductor
chip, a bonding enhancing layer on the second surface of the
semiconductor chip, a thermal interface material layer on the
bonding enhancing layer and in a gap between the bonding
enhancing layer and the heat dissipation member, wherein
the thermal interface material layer includes liquid metal,
and a porous barrier structure formed of a metal material and
surrounding the bonding enhancing layer and the thermal
interface material layer.

20 Claims, 10 Drawing Sheets

(51) Int. Cl.

| | | |
|---|---|---|
| *H10W 76/60* | (2026.01) | |
| *H10W 76/63* | (2026.01) | |
| *H10W 76/67* | (2026.01) | |

(52) U.S. Cl.
CPC ........ *H10W 90/724* (2026.01); *H10W 90/734* (2026.01); *H10W 90/736* (2026.01)

(56) References Cited

U.S. PATENT DOCUMENTS

| | | | |
|---|---|---|---|
| 9,847,275 | B2 | 12/2017 | Chainer et al. |
| 10,098,220 | B2 | 10/2018 | Liang et al. |
| 10,453,822 | B2 | 10/2019 | Kim et al. |
| 10,643,924 | B1 | 5/2020 | Shen |
| 10,777,483 | B1 | 9/2020 | Kazem et al. |
| 10,943,796 | B2 | 3/2021 | Berntson et al. |
| 11,031,319 | B2 | 6/2021 | Wu et al. |
| 2009/0142532 | A1 | 6/2009 | Furman et al. |
| 2009/0149021 | A1 | 6/2009 | Hillman et al. |
| 2016/0208387 | A1* | 7/2016 | Liu ..................... C23C 18/1667 |
| 2016/0329261 | A1* | 11/2016 | Hung .................. H01L 23/3736 |
| 2019/0221498 | A1 | 7/2019 | Wu et al. |
| 2019/0393118 | A1 | 12/2019 | Rawlings et al. |
| 2020/0091034 | A1* | 3/2020 | Shao ........................ H01L 24/13 |
| 2020/0211920 | A1* | 7/2020 | Lee ........................ H01L 24/73 |
| 2023/0048302 | A1* | 2/2023 | Hsieh .................... H01L 23/367 |
| 2023/0374627 | A1* | 11/2023 | Tsumagari ................ B22F 3/10 |

* cited by examiner

160

172
170
171

182       181

184     182

172
170
171

183     181

SEMICONDUCTOR PACKAGE

CROSS-REFERENCE TO RELATED APPLICATION(S)

This application claims priority under 35 U.S.C. § 119 to Korean Patent Application No. 10-2022-0113574 filed on Sep. 7, 2022, in the Korean Intellectual Property Office, the subject matter of which is hereby incorporated by reference in its entirety.

BACKGROUND

1. Field

The present inventive concept relates to a semiconductor package.

2. Description of Related Art

In accordance with lightweight and high performance desired for electronic devices, miniaturization and high performance are required in the semiconductor package field. Accordingly, research into rapidly dissipating heat emitted from semiconductor packages has been continuously conducted.

SUMMARY

An aspect of the present inventive concept is to provide a semiconductor package in which heat generation efficiency is improved and leakage of a thermal interface material layer between a semiconductor chip and a heat generating portion to the outside of the semiconductor package is reduced or prevented.

According to an aspect of the present inventive concept, a semiconductor package includes: a package substrate; a semiconductor chip on the package substrate and having a first surface facing the package substrate and a second surface, opposite to the first surface; an encapsulant on the package substrate and on a side surface of the semiconductor chip; a heat dissipation member on the semiconductor chip and spaced apart from the semiconductor chip; a bonding enhancing layer on the second surface of the semiconductor chip; a thermal interface material layer on the bonding enhancing layer and in a gap between the bonding enhancing layer and the heat dissipation member wherein the thermal interface material layer includes a liquid metal; and a porous barrier structure formed of a metal material and surrounding the bonding enhancing layer and the thermal interface material layer.

According to another aspect of the present inventive concept, a semiconductor package includes: a package substrate; a semiconductor chip on the package substrate; a bonding enhancing layer on an upper portion of the semiconductor chip; a heat dissipation member on the semiconductor chip and spaced apart from the semiconductor chip; a thermal interface material layer on the bonding enhancing layer and in a gap between the semiconductor chip and the heat dissipation member, wherein the thermal interface material layer includes a liquid metal; and a porous barrier structure on a side surface of the thermal interface material layer, wherein the porous barrier structure comprises a metal material and air permeable pores, wherein the thermal interface material layer does not extend into the air permeable pores of the porous barrier structure.

According to another aspect of the present inventive concept, a semiconductor package includes: a package substrate; a semiconductor chip on the package substrate; a heat dissipation member on the semiconductor chip and spaced apart from the semiconductor chip; a bonding enhancing layer on the semiconductor chip; a thermal interface material layer in a gap between the semiconductor chip and the bonding enhancing layer, the thermal interface material layer including a liquid metal; and a porous barrier structure including a metal material and on a side surface of the thermal interface material layer.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
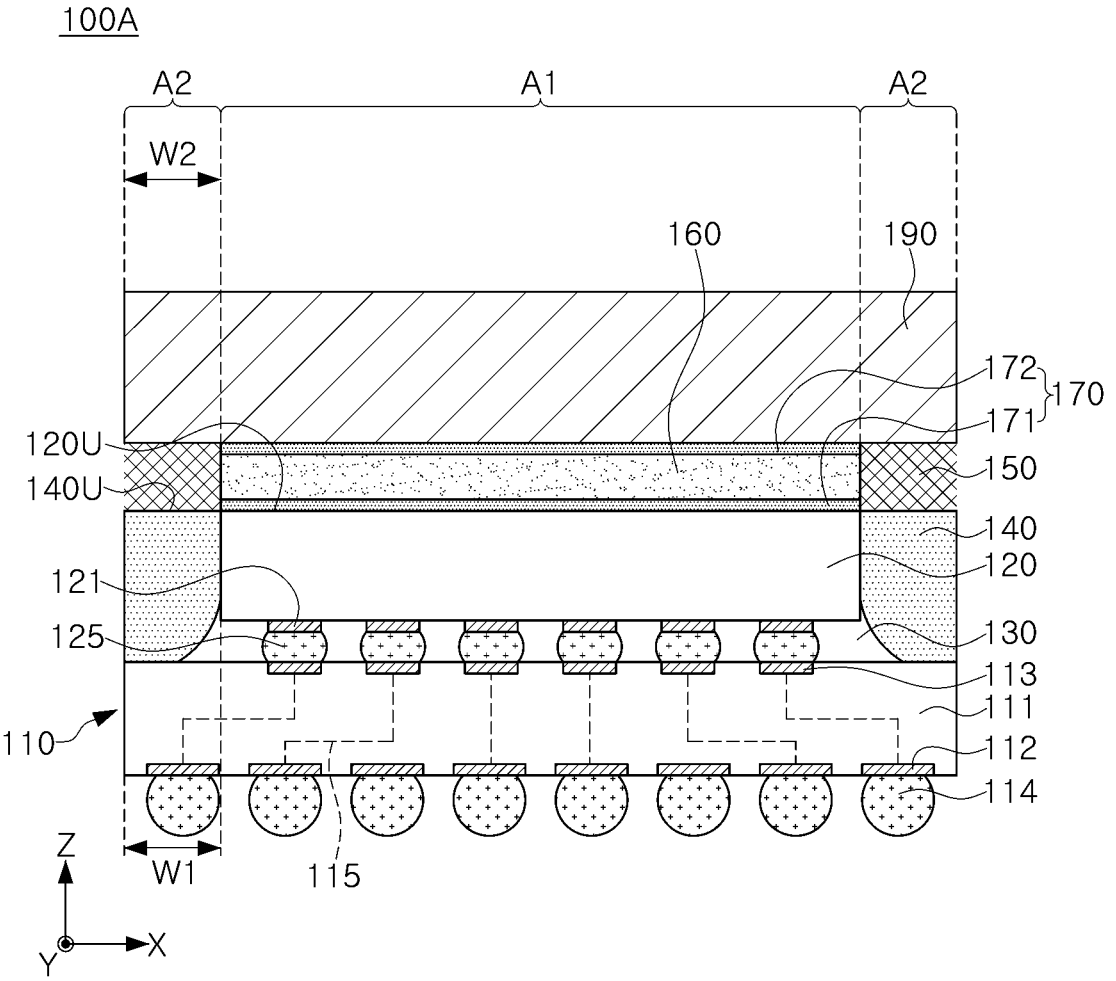
FIG. 1 is a cross-sectional view of a semiconductor package according to an embodiment of the present inventive concept.
Figure 2:
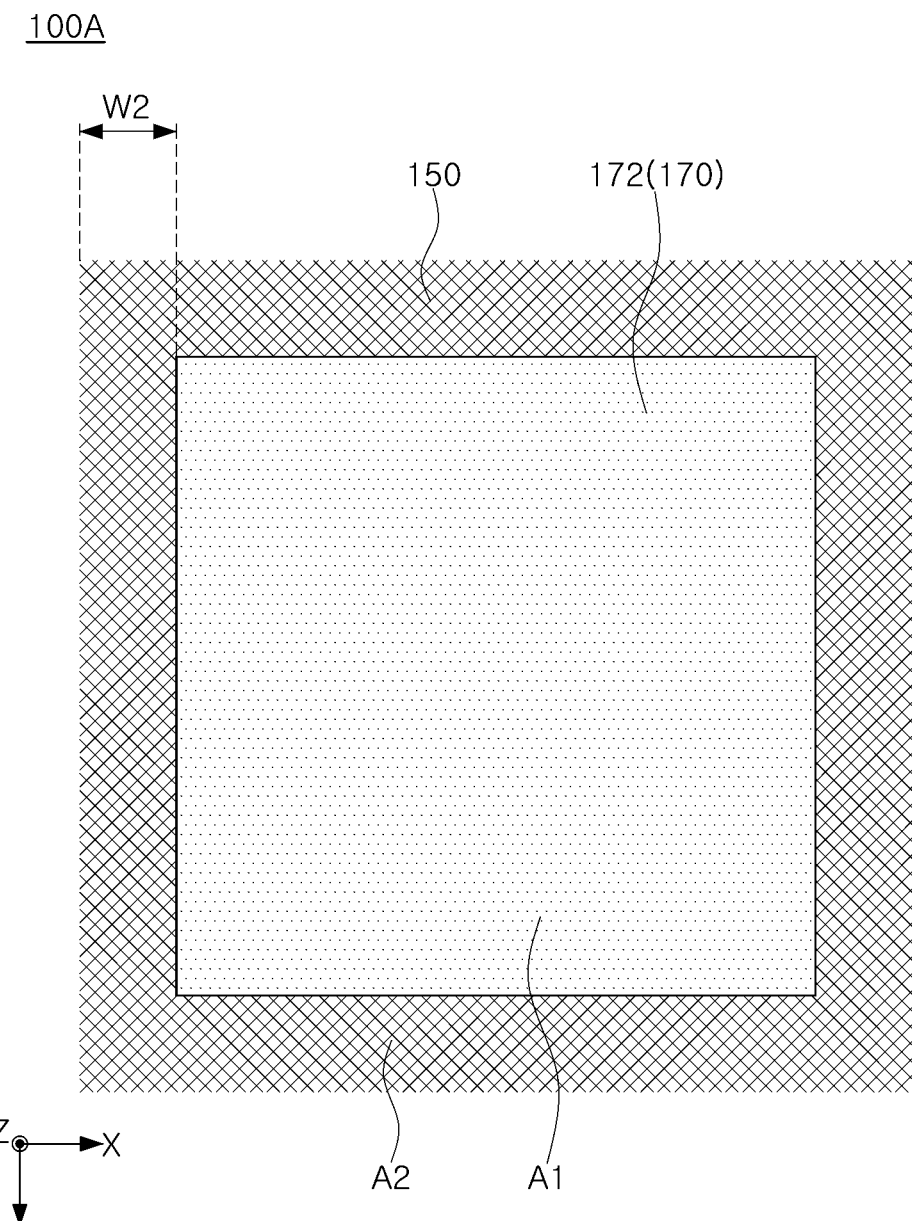
FIG. 2 is a plan view of the semiconductor package of FIG. 1 without a heat dissipation member.

A semiconductor package 100A according to an example embodiment will be described with reference to FIGS. 1 to 4. FIG. 1 is a cross-sectional view of a semiconductor package according to an example embodiment, and FIG. 2 is a plan view of the semiconductor package of FIG. 1 without a heat dissipation member. FIGS. 3(*a*) and 3(*b*) are various modified examples of a bonding enhancing layer of FIG. 1, and FIG. 4 is a view illustrating a state in which a pressure-applied thermal interface material layer is supported by a porous barrier structure.

Referring to FIGS. 1 and 2, a semiconductor package 100A according to an embodiment may include a package substrate 110, a semiconductor chip 120, an encapsulant 140, a porous barrier structure 150, a thermal interface material layer 160, a bonding enhancing layer 170, and a heat dissipation member 190. According to an embodiment, the semiconductor package 100A of an embodiment may further include an external connection terminal 114.

The package substrate 110 may include a body 111, a lower pad 112 on a lower surface of the body 111, an upper pad 113 on an upper surface of the body 111, and a redistribution circuit 115 electrically connecting the lower pad 112 and the upper pad 113. The package substrate 110 is a support substrate on which the semiconductor chip 120 is mounted, and may be a substrate for a semiconductor package including a printed circuit board (PCB), a ceramic substrate, a glass substrate, a tape wiring board, and the like. The body 111 of the package substrate 110 may include different materials depending on the type of substrate. For example, when the package substrate 110 is a PCB, the body 111 may be a copper-clad laminate or may be in the form in which a wiring layer is additionally stacked on one or both surfaces of the copper-clad laminate. Solder resist layers may be formed on the lower and upper surfaces of the package substrate 110, respectively. The lower pad 112, the upper pad 113, and the redistribution circuit 115 may form an electrical path connecting the lower surface and the upper surface of the package substrate 110. The lower pad 112, the upper pad 113, and the redistribution circuit 115 may comprise one or more metals, such as copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C) or alloys including two or more metals thereof. The redistribution circuit 115 may include multiple redistribution layers and a via connecting them. The external connection terminal 114 connected to the lower pad 112 may be on the lower surface of the package substrate 110. The external connection terminal 114 may include tin (Sn), indium (In), bismuth (Bi), antimony (Sb), copper (Cu), silver (Ag), zinc (Zn), lead (Pb) and/or alloys thereof.

At least one semiconductor chip 120 may be on the upper surface of the package substrate 110 and may include a connection pad 121 electrically connected to the upper pad 113 of the package substrate 110. The semiconductor chip 120 may include silicon (Si), germanium (Ge), or gallium arsenide (GaAs), and various types of integrated circuits (ICs) may be formed. An IC may be a processor chip, such as a central processor (e.g., CPU), a graphics processor (e.g., GPU), a field programmable gate array (FPGA), an application processor (AP), a digital signal processor, a cryptographic processor, a microprocessor, a microcontroller, and the like. However, the present inventive concept is not limited thereto, and the IC may be a logic chip, such as an analog-to-digital converter (ADC) and an application-specific IC (ASIC), or a memory chip, such as a volatile memory (e.g., DRAM) or a non-volatile memory (e.g., ROM and flash memory). For example, the semiconductor chip 120 may be mounted on the package substrate 110 in a flip-chip method. The semiconductor chip 120 may be connected to the upper pad 113 through a ball or post-shaped metal bump. For example, the semiconductor chip 120 may be electrically connected to the upper pad 113 through the solder bump 125, but is not limited thereto. According to embodiments, the semiconductor chip 120 may be directly connected to the upper pad 113 without a separate bump or may be mounted on the package substrate 110 by wire bonding. The connection pad 121 may be a pad of a bare chip (e.g., an aluminum (Al) pad or may be a pad (e.g., a copper (Cu) pad) of a packaged chip according to an example embodiment.

The encapsulant 140 may seal at least a portion of the semiconductor chip 120 on the upper surface of the package substrate 110. In some embodiments, the encapsulant 140 may be positioned to cover only the side surface of the semiconductor chip 120. In this case, an upper surface 140U of the encapsulant 140 may be coplanar with an upper surface 120U of the semiconductor chip 120. However, the present inventive concept is not limited thereto, and the encapsulant 140 may cover both the side surface and the upper surface of the semiconductor chip 120. In addition, the upper surface 140U of the encapsulant 140 may be located on a level lower or higher than that of the upper surface 120U of the semiconductor chip 120. The encapsulant 140 may include, for example, a thermosetting resin, such as an epoxy resin, a thermoplastic resin, such as polyimide, or a prepreg including an inorganic filler or/and glass fiber, ABF, FR-4, BT, epoxy molding compound (EMC). The encapsulant 140 may have a molded underfill (MUF) structure integrally formed with an underfill resin between the semiconductor chip 120 and the package substrate 110, but is not limited thereto. According to an embodiment, the encapsulant 140 may have a capillary underfill (CUF) structure in which an underfill resin 130 below the semiconductor chip 120 is distinguished.

Referring to FIGS. 1 and 2, the bonding enhancing layer 170 may be applied to the upper surface 120U of the semiconductor chip 120 to define a region (hereinafter, referred to as a 'first region A1') in which the thermal interface material layer 160 is positioned. That is, in order to stably apply the thermal interface material layer 160 having low wettability to the upper surface 120U of the semiconductor chip 120, the bonding enhancing layer may be formed in the first region A1 in which the thermal interface material layer 160 is to be formed, and then, the thermal interface material layer 160 may be applied. The bonding enhancing layer 170 may be on or entirely cover the upper surface 120U of the semiconductor chip 120, but is not limited thereto, and the bonding enhancing layer 170 may partially cover the upper surface 120U of the semiconductor chip 120. According to an embodiment, the bonding enhancing layer 170 may be on only a partial region of the upper surface 120U of the semiconductor chip 120 and may extend to a partial region of the upper surface 140U of the encapsulant 140. The bonding enhancing layer 170 may include a material having high wettability so that the thermal interface material layer 160 having low wettability may be attached to the upper surface 120U of the semiconductor chip 120. In addition, the bonding enhancing layer 170 has an effect of reducing thermal resistance by forming a eutectic metal layer at an interface with a liquid metal constituting the thermal interface material layer 160. For example, when the liquid metal is an alloy of gallium, indium, and tin, the bonding enhancing layer 170 may be formed of a material including at least one of gallium (Ga), tin (Sn), and copper (Cu).

In an embodiment, a case in which the bonding enhancing layer 170 is on both the upper and lower surfaces of the thermal interface material layer 160 will be described as an example, but the present inventive concept is not limited thereto. The bonding enhancing layer 170 may be on only one of the upper and lower surfaces of the thermal interface material layer 160. For example, the bonding enhancing layer 170 may only be on the lower surface of the thermal interface material layer 160.

According to an embodiment, in the process of forming the bonding enhancing layer 170, a material layer may be further formed to improve contact properties of the bonding enhancing layer 170 or to reduce or prevent corrosion or oxidation of the bonding enhancing layer. This will be described with reference to FIGS. 3(a) and 3(b).

Figure 3A:
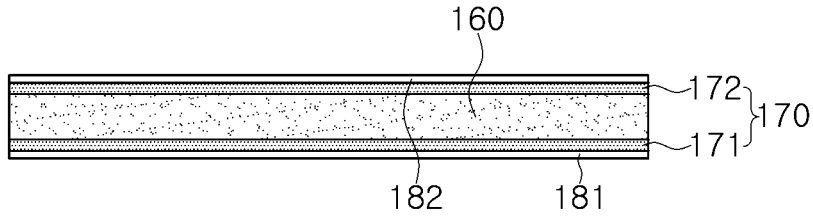
FIGS. 3(*a*) and 3(*b*) are various modified examples of a bonding enhancing layer of FIG. 1.
Figure 4:
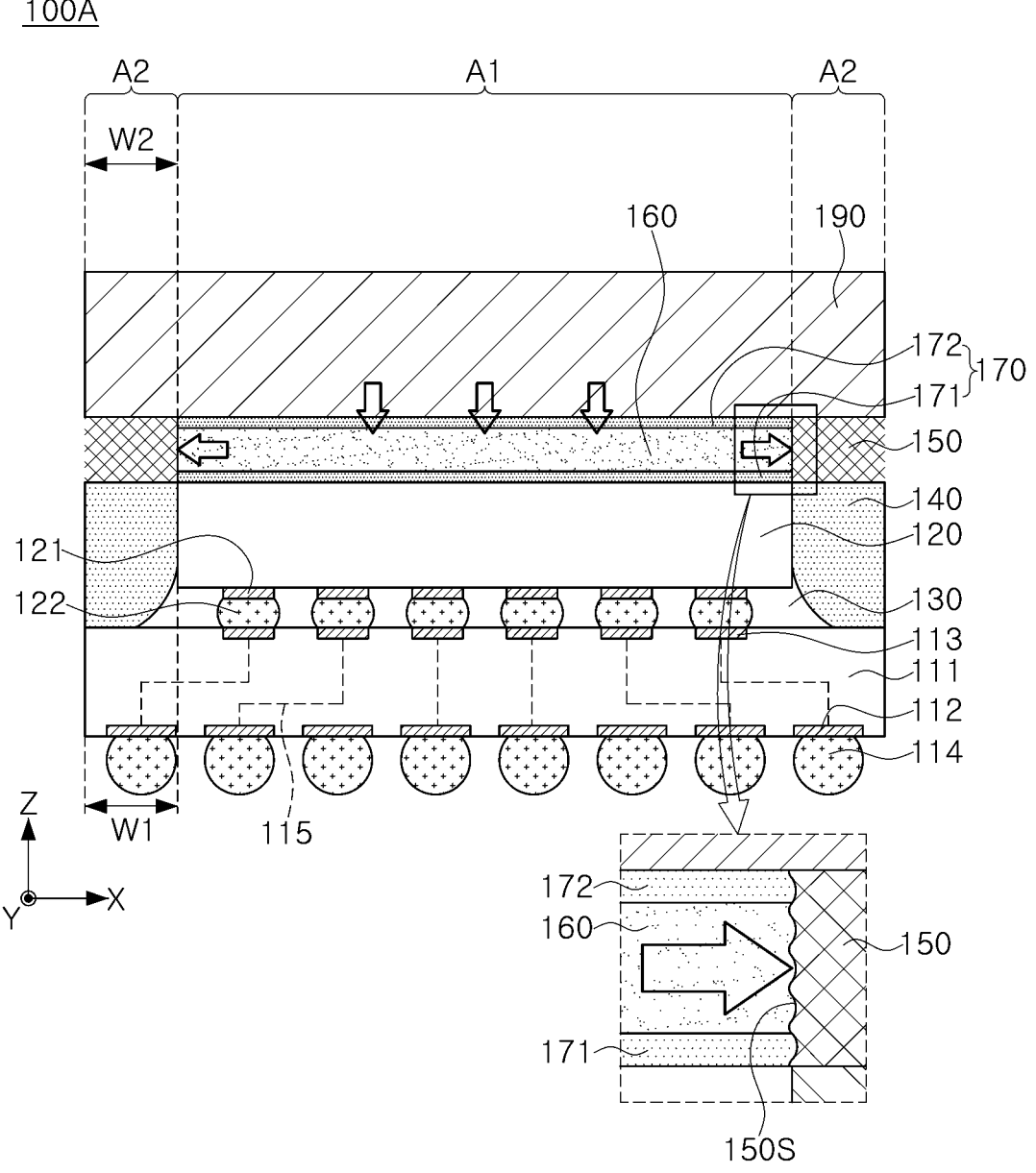
FIG. 4 is a view illustrating a state in which a pressure-applied thermal interface material layer is supported on a porous barrier structure.

Referring to FIG. 3(a), in the process of forming the bonding enhancing layer 170, adhesive layers 181 and 182 may be further configured to improve contact between the bonding enhancing layer 170 and the surface on which the bonding enhancing layer 170 is positioned. For example, the adhesive layers 181 and 182 may include at least one of gold (Au), platinum (Pt), and iridium (Ir). For example, when the first bonding enhancing layer 171 and the second bonding enhancing layer 172 are on the lower and upper surfaces of the thermal interface material layer 160, respectively, a first adhesive layer 181 and a second adhesive layer 182 may be respectively on the lower surface of the first bonding enhancing layer 171 and the upper surface of the second bonding enhancing layer 172.

Figure 3B:
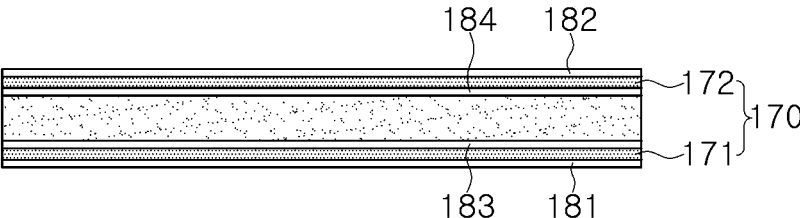

Referring to FIG. 3(b), barrier layers 183 and 184 for reducing or preventing corrosion or oxidation of the bonding enhancing layer 170 may be between the bonding enhancing layer 170 and the thermal interface material layer 160. For example, when the bonding enhancing layer 170 is formed of a metal, such as copper that is vulnerable to corrosion or oxidation, the barrier layers 183 and 184 may be between the bonding enhancing layer 170 and the thermal interface material layer 160 to reduce or prevent the bonding enhancing layer 170 from being corroded or oxidized. For example, the barrier layers 183 and 184 may include at least one of stainless steel (SUS), gold (Au), platinum (Pt), and nickel (Ni). For example, when the first bonding enhancing layer 171 and the second bonding enhancing layer 172 are on the lower and upper surfaces of the thermal interface material layer 160, respectively, the first barrier layer 183 may be between the first bonding enhancing layer 171 and the thermal interface material layer 160 and the second barrier layer 184 may be between the second bonding enhancing layer 172 and the thermal interface material layer 160.

The thermal interface material layer 160 may be between the semiconductor chip 120 and the heat dissipation member 190. The thermal interface material layer 160 may improve thermal conduction efficiency by allowing the semiconductor chip 120 and the heat dissipating member 190 to be in thermal contact with each other. The thermal interface material layer 160 may include a liquid metal. The liquid metal may be formed of an alloy including gallium (Ga), indium (In), and tin (Sn). In an embodiment, the liquid metal may include gallium (Ga). The thermal interface material layer 160 formed of liquid metal has excellent heat dissipation characteristics, but since the thermal interface material layer 160 has liquid properties, the thermal interface material layer 160 may thermally expand and contract according to a state of the semiconductor chip 120, and as a result, the thermal interface material layer 160 may squeeze out in a lateral direction of the semiconductor package 100A.

The porous barrier structure 150 may be on or adjacent a side surface of the thermal interface material layer 160, i.e., to surround the thermal interface material layer 160 to reduce or prevent the thermal interface material layer 160 from leaking toward the side of the semiconductor package 100A due to pressure or heat. The porous barrier structure 150 may be in a second region A2 that does not include the first region A1 where the thermal interface material layer 160 is positioned. However, the porous barrier structure 150 does not have to completely fill the second region A2, and may be spaced apart from the circumference of the thermal interface material layer 160. The porous barrier structure 150 may be on or adjacent a side surface of the thermal interface material layer 160, i.e., to surround a side surface of the thermal interface material layer 160 and fill a gap between the encapsulant 140 and the heat dissipation member 190, but is not limited thereto. For example, the porous barrier structure 150 may be on or adjacent a side surface of the thermal interface material layer 160 and the semiconductor chip, i.e., to surround the thermal interface material layer 160 and the side surface of the semiconductor chip 120. A width W2 of the porous barrier structure 150 may have substantially the same size as a width W1 of the encapsulant 140, but the present inventive concept is not limited thereto, and the width W2 of the porous barrier structure 150 may be greater or less than the width W1 of the encapsulant 140.

The porous barrier structure 150 may include pores having air permeability. For example, a metal material may have a foam form. Accordingly, the porous barrier structure 150 may have both porosity and air permeability. For example, the porous barrier structure 150 may be formed of at least one of copper and nickel. Since the porous barrier structure 150 has both porosity and air permeability, the porous barrier structure 150 may be used as a barrier to reduce or prevent permeation of the thermal interface material layer 160, which is a liquid, while allowing gas to pass therethrough when pressure is applied from the thermal interface material layer 160.

Referring to FIG. 4, when the thermal interface material layer 160 presses a side surface 150S of the porous barrier structure 150 by pressure or heat, the thermal interface material layer 160 does not pass through pores of the porous barrier structure 150 due to low wettability and surface tension thereof. The thermal interface material layer 160 may be thermally conductive. The porous barrier structure 150 reduces or prevents the thermal interface material layer 160 from leaking on a side of the of the semiconductor package 100A, for example, when pressure is applied to the package. Since the porous barrier structure 150 is formed of an elastic metal material, the porous barrier structure 150 may be deformed by a force pressing the side surface 150S and support the thermal interface material layer 160. In addition, when pressure or heat applied to the thermal interface material layer 160 is removed, the porous barrier structure 150 may be restored to its original state by elasticity.

In addition, since the porous barrier structure 150 is formed of a metal material, heat transmitted through the thermal interface material layer 160 may be effectively dissipated. According to the embodiment, the surface of the porous barrier structure 150 may be coated with a material including at least one of gallium, indium, and tin.

The heat dissipation member 190 may be on the semiconductor chip 120 to dissipate heat conducted through the thermal interface material layer 160 externally. The entire heat dissipation member 190 may be formed of a single material, or may include members formed of different materials, combined in consideration of heat storage characteristics. The heat dissipation member 190 may be formed of metal, a carbon-based material, a polymer material, or combinations thereof, but is not limited thereto. The heat dissipation member 190 may be formed of a metal having excellent thermal conductivity, such as copper, an aluminum alloy, a stainless alloy, or a magnesium alloy.

Figure 5:
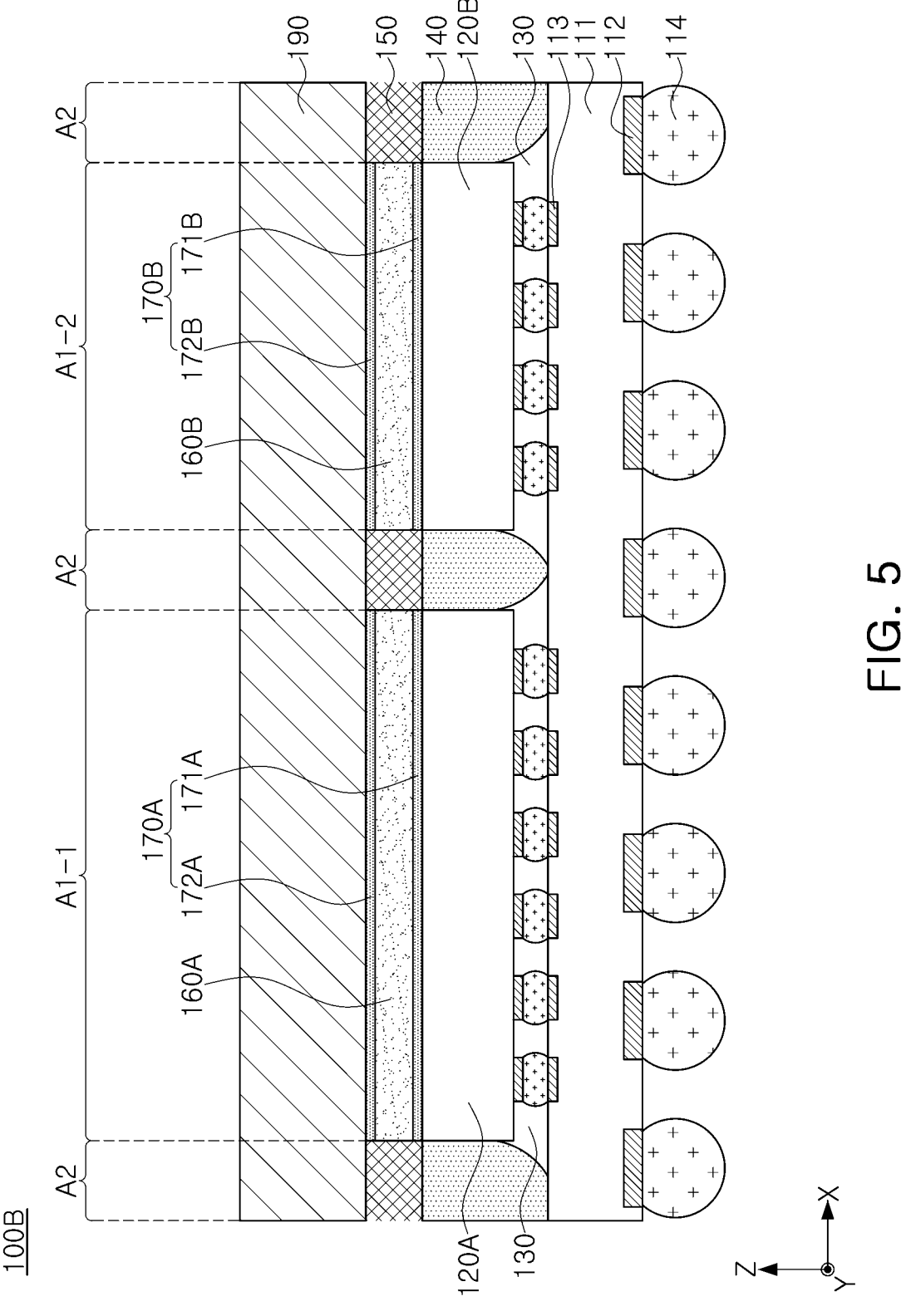
FIG. 5 is a cross-sectional view of a semiconductor package according to an embodiment of the present inventive concept.
Figure 6:
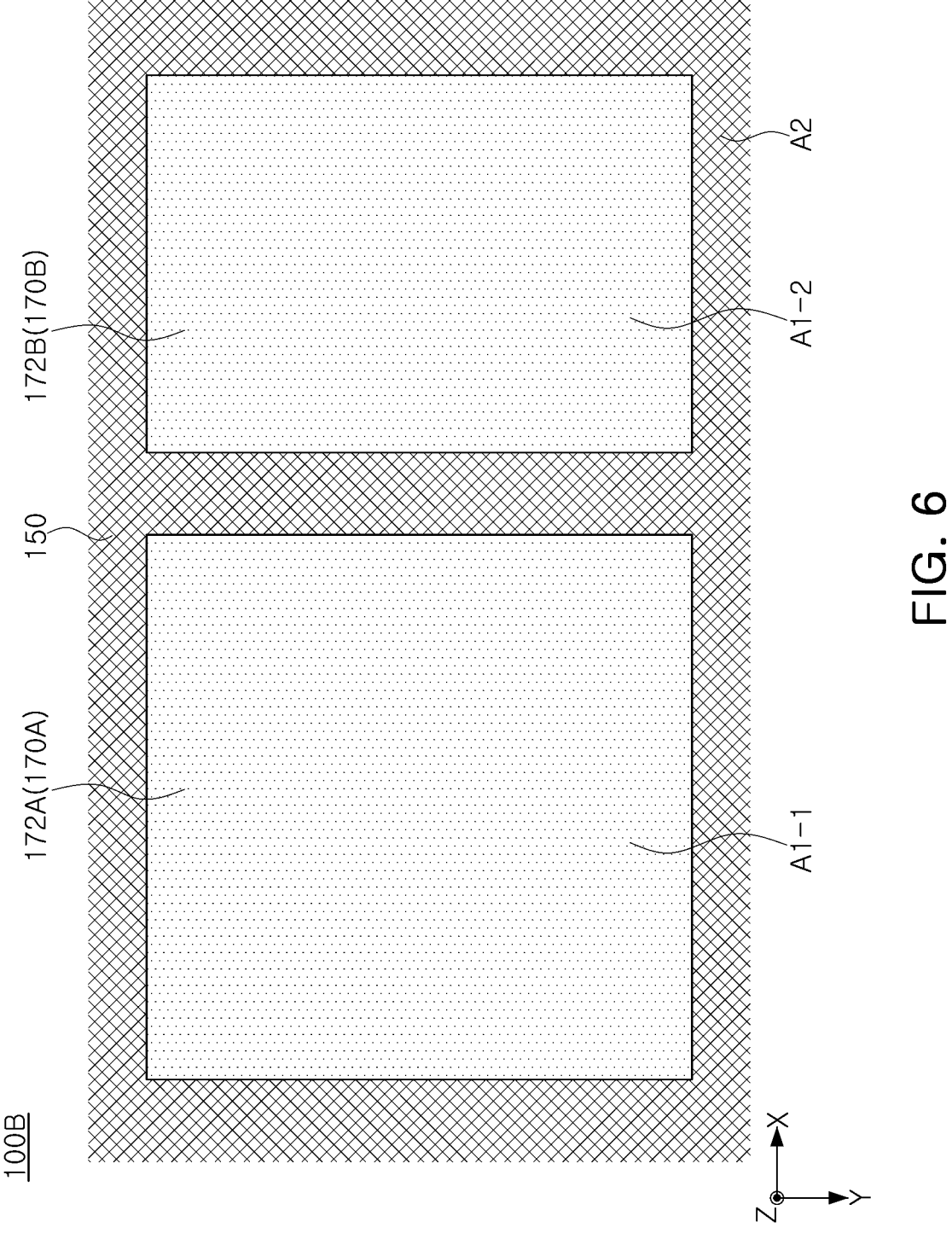
FIG. 6 is a plan view of the semiconductor package of FIG. 5 without a heat dissipation member.

A semiconductor package 100B according to an example embodiment will be described with reference to FIGS. 5 and 6. FIG. 5 is a cross-sectional view of a semiconductor package according to an example embodiment, and FIG. 6 is a plan view of the semiconductor package of FIG. 5 without a heat dissipation member. Compared to the semiconductor package 100A of the embodiment described above, the semiconductor package 100B according to an embodiment has characteristics the same as or similar to those of the semiconductor package 100A described above with reference to FIGS. 1 through 3, except that a plurality of semiconductor chips 120A and 120B and thermal interface material layers 160A and 160B are respectively on the plurality of semiconductor chips 120A and 120B.

Referring to FIGS. 5 and 6, the semiconductor package 100B according to an embodiment may include a package substrate 110, a plurality of semiconductor chips 120A and 120B, an encapsulant 140, a porous barrier structure 150, thermal interface material layers 160A and 106B, bonding enhancing layers 170A and 170B, and a heat dissipation member 190.

The plurality of semiconductor chips 120A and 120B may respectively be mounted on the package substrate 100. Upper surfaces of the plurality of semiconductor chips 120A and 120B may be at substantially the same level. The encapsulant 140 may be on or surround respective side surfaces of the plurality of semiconductor chips 120A and 120B. The thermal interface material layers 160A and 106B and the bonding enhancing layers 170A and 170B may be on the plurality of semiconductor chips 120A and 120B, respectively. In other words, a plurality of first regions A1-1 and A1-2 on which the thermal interface material layers 160A and 160B are positioned may be provided in plural to correspond to the plurality of semiconductor chips 120A and 120B. First bonding enhancing layers 171A and 171B and second bonding enhancing layers 172A and 172B may be on the lower and upper surfaces of the thermal interface material layers 160A and 160B, respectively. The second region A2 in which the porous barrier structure 150 is positioned may be around or encircle each of the plurality of first regions A1-1 and A1-2.

Referring to FIGS. 7 to 10, various embodiments of a semiconductor package according to an embodiment will be described. FIGS. 7 to 10 are cross-sectional views of a semiconductor package according to an example embodiment of the present inventive concept.

Figure 7:
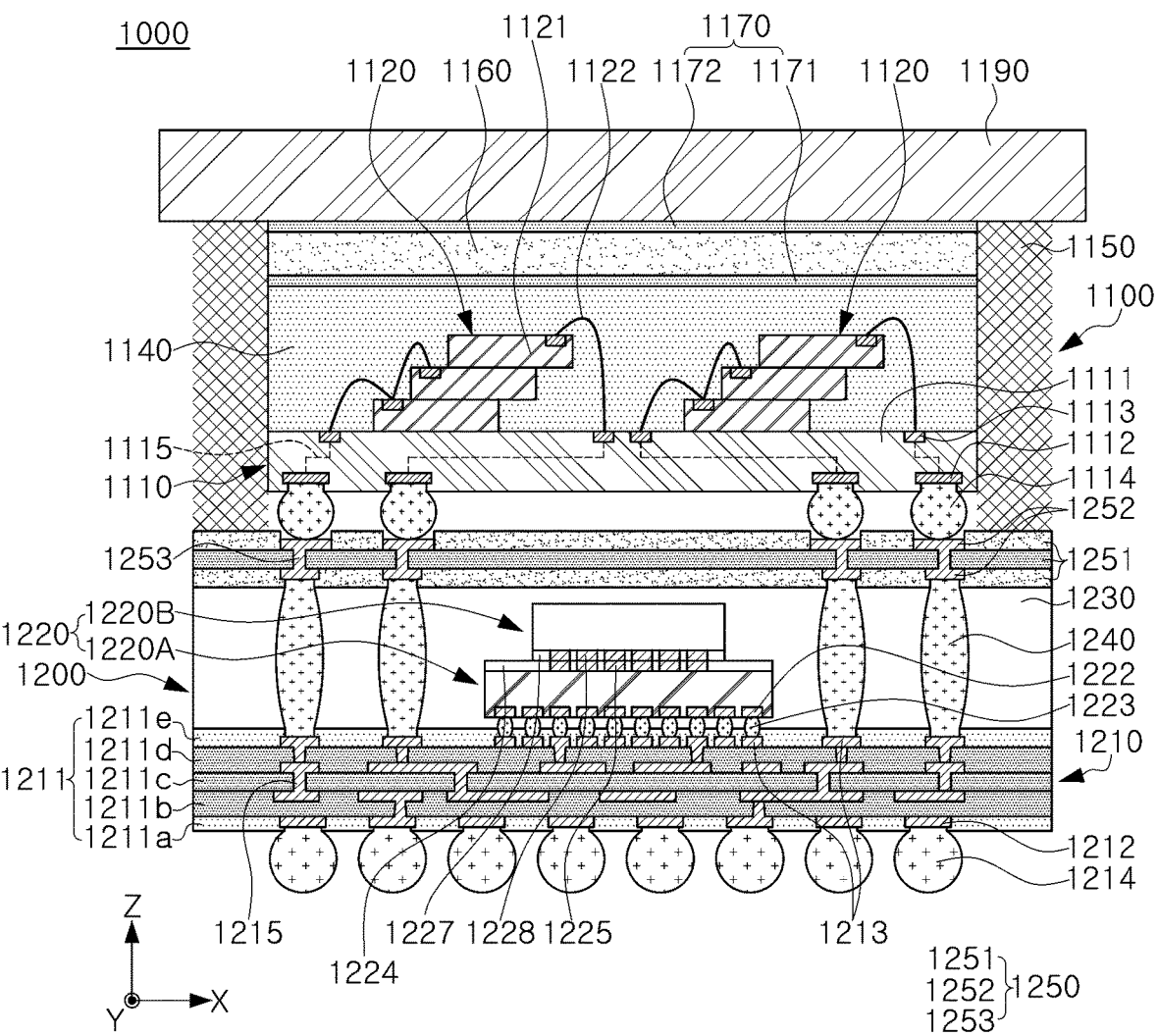
FIGS. 7, 8, 9, and 10 are cross-sectional views of a semiconductor package according to an example embodiment of the present inventive concept.

Referring to FIG. 7, a semiconductor package 1000 according to an example embodiment may include a first semiconductor package 1100 disposed above and a second semiconductor package 1200 below the first semiconductor package 1100. The first semiconductor package 1100 may be understood as having characteristics the same as or similar to those of the semiconductor package 100A described above with reference to FIGS. 1 to 3, except that the porous barrier structure 1150 may be positioned to be on or surround the thermal interface material layer 1160, the encapsulant 1140, and side surfaces of the first package substrate 1110 and the encapsulant 1140 is positioned to cover a first semiconductor chip stack 1120 in which a plurality of semiconductor chips 1121 are stacked.

The first semiconductor package 1100 may include the first package substrate 1110, the first semiconductor chip stack 1120, the first encapsulant 1140, a porous barrier structure 1150, a thermal interface material layer 1160, and bonding enhancing layer 1170, and a heat dissipation member 1190.

The first package substrate 1110 may include a first lower pad 1112 on a lower surface of a body 1111, a first upper pad 1113 on an upper surface of the body 1111, and a first redistribution circuit 1115 electrically connecting the first lower pad 1112 and the first upper pad 1113.

The first semiconductor chip stack 1120 may include a plurality of semiconductor chips 1121, and the plurality of semiconductor chips 1121 may be mounted on the first package substrate 1110 by wire bonding or flip chip bonding. For example, the plurality of first semiconductor chips 1121 maybe stacked on the first package substrate 1110 in a vertical direction, and may be electrically connected to the upper pad 1113 of the first package substrate 1110 by bonding wires 1122. For example, the first semiconductor chip stack 1120 may include a memory chip. An external connection terminal 1114 connected to the lower pad 1112 may be on the lower surface of the first package substrate 1110.

The first encapsulant 1140 may be on the first semiconductor chip stack 1120. The thermal interface material layer 1160 and the bonding enhancing layer 1170 may be positioned to cover the first encapsulant 1140. The porous barrier structure 1150 may be on a side surface of the first package substrate 1110, a side surface of the first encapsulant 1140, the thermal interface material layer 1160, and a side surface of the bonding enhancing layer 1170. The heat dissipation member 1190 may be supported by the porous barrier structure 1150 and may be on the thermal interface material layer 1160 and the bonding enhancing layer 1170. The bonding enhancing layer 1170 may include a first bonding enhancing layer 1171 and a second bonding enhancing layer 1172, respectively, on the lower and upper surfaces of the thermal interface material layer 1160.

The second semiconductor package 1200 may include a second package substrate 1210, a second semiconductor chip stack 1220, a second encapsulant 1230, an interposer substrate 1250, and a connection structure 1240.

The second package substrate 1210 may include an insulating layer 1211, a second lower pad 1212 on a lower surface of the insulating layer 1211, a second upper pad 1213 on an upper surface of the insulating layer 1211, and a second redistribution circuit 1215 electrically connecting the second lower pad 1212 and the second upper pad 1213. The insulating layer 1211 may include a plurality of insulating layers 1211a to 1211e. External connection terminals 1214 may be on the second lower pad 1212.

The second semiconductor chip stack 1220 may be mounted on the second package substrate 1210 using a flip chip bonding method. For example, the second semiconductor chip stack 1220 may include a second lower semiconductor chip 1220A and a second upper semiconductor chip 1220B, and the second lower semiconductor chip 1220A and the second upper semiconductor chip 1220B may be stacked on the second package substrate 1210 in a vertical direction. For example, the second lower semiconductor chip 1220A may include a logic chip, and the second upper semiconductor chip 1220B may include an application processor (AP). An electrode pad 1222 may be on a lower surface of the second lower semiconductor chip 1220A, and may be electrically connected to the second upper pad 1213 through a solder bump 1223. An upper insulating layer 1224 and a connection pad 1225 may be on an upper surface of the second lower semiconductor chip 1220A. A lower insulating layer 1227 and an electrode pad 1228 may be on a lower surface of the second upper semiconductor chip 1220B. The lower insulating layer 1227 and the electrode pad 1228 of the second upper semiconductor chip 1220B may be bonded to the upper insulating layer 1224 and the connection pad 1225 of the second lower semiconductor chip 1220A, respectively.

The interposer substrate 1250 may be a redistribution substrate providing a redistribution layer on top of the second semiconductor package 1200 and may be positioned between a lower package and an upper package in a package-on-package structure. The interposer substrate 1250 may be on the semiconductor chip 1220 and may include an upper insulating layer 1251, an upper wiring layer 1252, and a wiring via 1253. The uppermost upper insulating layer 1251 may include openings exposing at least a portion of the upper wiring layer 1252. The external connection terminal 1114 of the first semiconductor package substrate 1110 may be electrically connected to the upper wiring layer 1252.

The connection structure 1240 may be between the second package substrate 1210 and the interposer substrate 1250 and pass through the second encapsulant 1230 to electrically connect the second package substrate 1210 and the interposer substrate 1250. The connection structure 1240 may extend in a vertical direction (a Z-axis direction) between the second package substrate 1210 and the interposer substrate 1250 to provide a vertical connection path electrically connecting the second redistribution circuit 1215 and the upper wiring layer 1252. The connection structure 1240 may have a spherical or ball shape formed of a low melting point metal, such as tin (Sn), indium (In), bismuth (Bi), antimony (Sb), copper (Cu), silver (Ag), zinc (Zn), lead (Pb), or alloys (e.g., Sn—Ag—Cu) thereof. According to an embodiment, a core ball formed of a polymer material including a thermoplastic resin or a thermosetting resin or a metal material distinct from solder may be inside the connection structure 1240.

Figure 8:
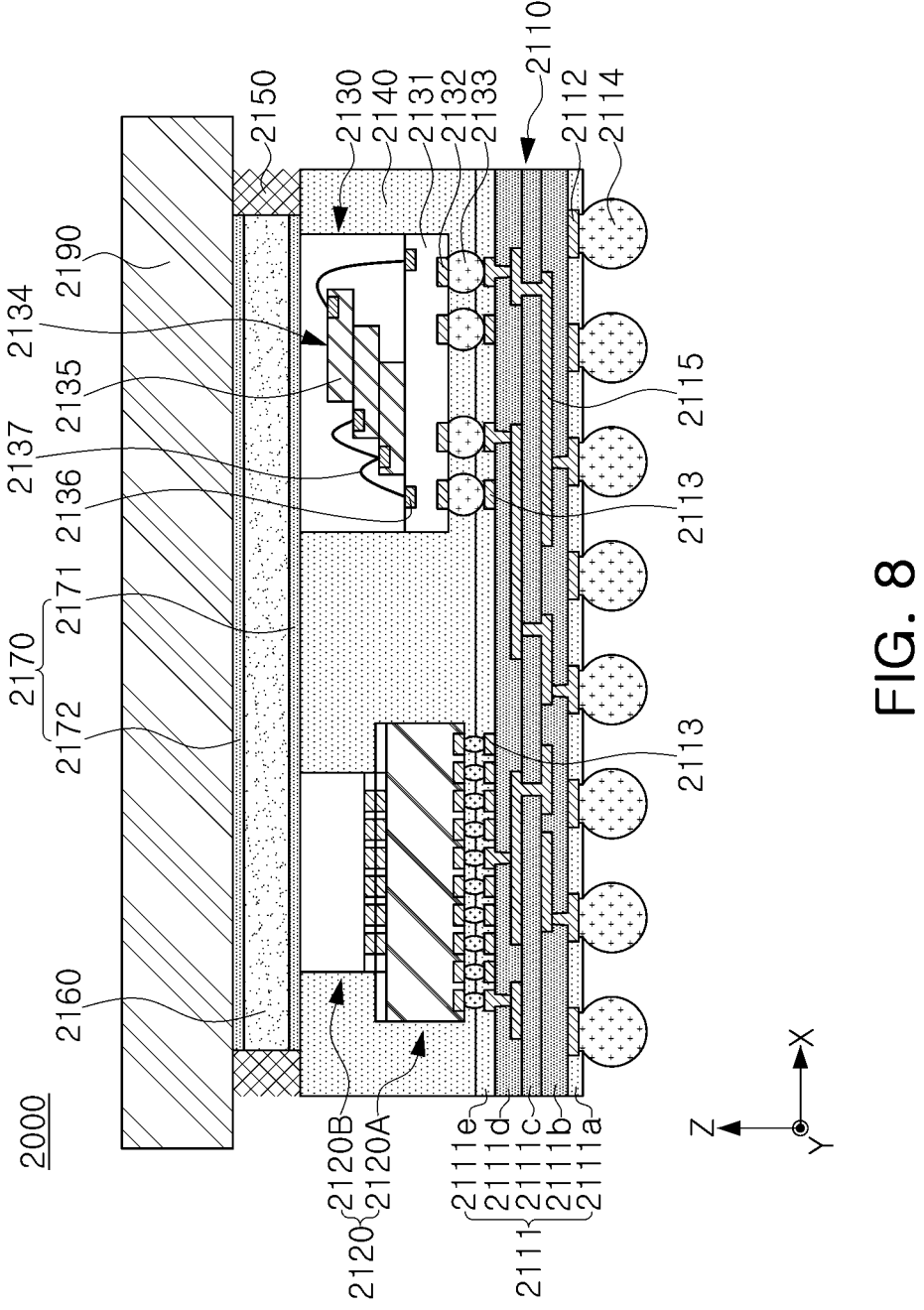

Referring to FIG. 8, a semiconductor package 2000 according to an example embodiment may be understood as having characteristics the same as or similar to those of the semiconductor package 100A described above with reference to FIGS. 1 to 3, except that first and second semiconductor chips 2120 and 2130 are on a package substrate 2110.

The semiconductor package 2000 includes a package substrate 2110, first and second semiconductor chips 2120 and 2130, an encapsulant 2140, a porous barrier structure 2150, a thermal interface material layer 2160, a bonding enhancing layer 2170, and a heat dissipation member 2190. The bonding enhancing layer 2170 may include a first bonding enhancing layer 2171 and a second bonding enhancing layer 2172 respectively on lower and upper surfaces of the thermal interface material layer 2160.

The package substrate 2110 may include an insulating layer 2111, and may include a lower pad 2112 on a lower surface of the insulating layer 2111, an upper pad 2113 on an upper surface of the insulating layer 2111, and a redistribution circuit 2115 electrically connecting the lower pad 2112 and the upper pad 2113. The insulating layer 2111 may include a plurality of insulating layers 2111a to 2111e. External connection terminals 2114 may be on the lower pad 2112.

The first semiconductor chip 2120 may be mounted on the package substrate 2110 using a flip chip bonding method. For example, the first semiconductor chip 2120 may be a semiconductor chip stack including a first lower semiconductor chip 2120A and a first upper semiconductor chip 2120B. The first lower semiconductor chip 2120A and the first upper semiconductor chip 2120B may be understood as having characteristics the same as or similar to those of the second lower semiconductor chip 1220A and the second upper semiconductor chip 1220B of the semiconductor package 1000 described above with reference to FIG. 7.

The second semiconductor chip 2130 may be mounted on the package substrate 2110 using a flip chip bonding method. The second semiconductor chip 2130 may include a semiconductor chip stack 2134 including a plurality of semiconductor chips 2135. In the second semiconductor chip 2130, a plurality of semiconductor chips 2135 may be vertically stacked on a circuit board 2131 and electrically connected to an upper pad 2136 of the circuit board 2131 by a bonding wire 2137. For example, the plurality of semiconductor chips 2135 may include a memory chip. A solder bump 2133 connected to the lower pad 2132 may be on a lower surface of the circuit board 2131.

The encapsulant 2140 may be on the package substrate 2110 to cover side surfaces of the first semiconductor chips

2120 and the second semiconductor chips 2130. The bonding enhancing layer 2170 and the thermal interface material layer 2160 may be positioned to simultaneously cover the first semiconductor chips 2120 and the second semiconductor chips 2130.

Figure 9:
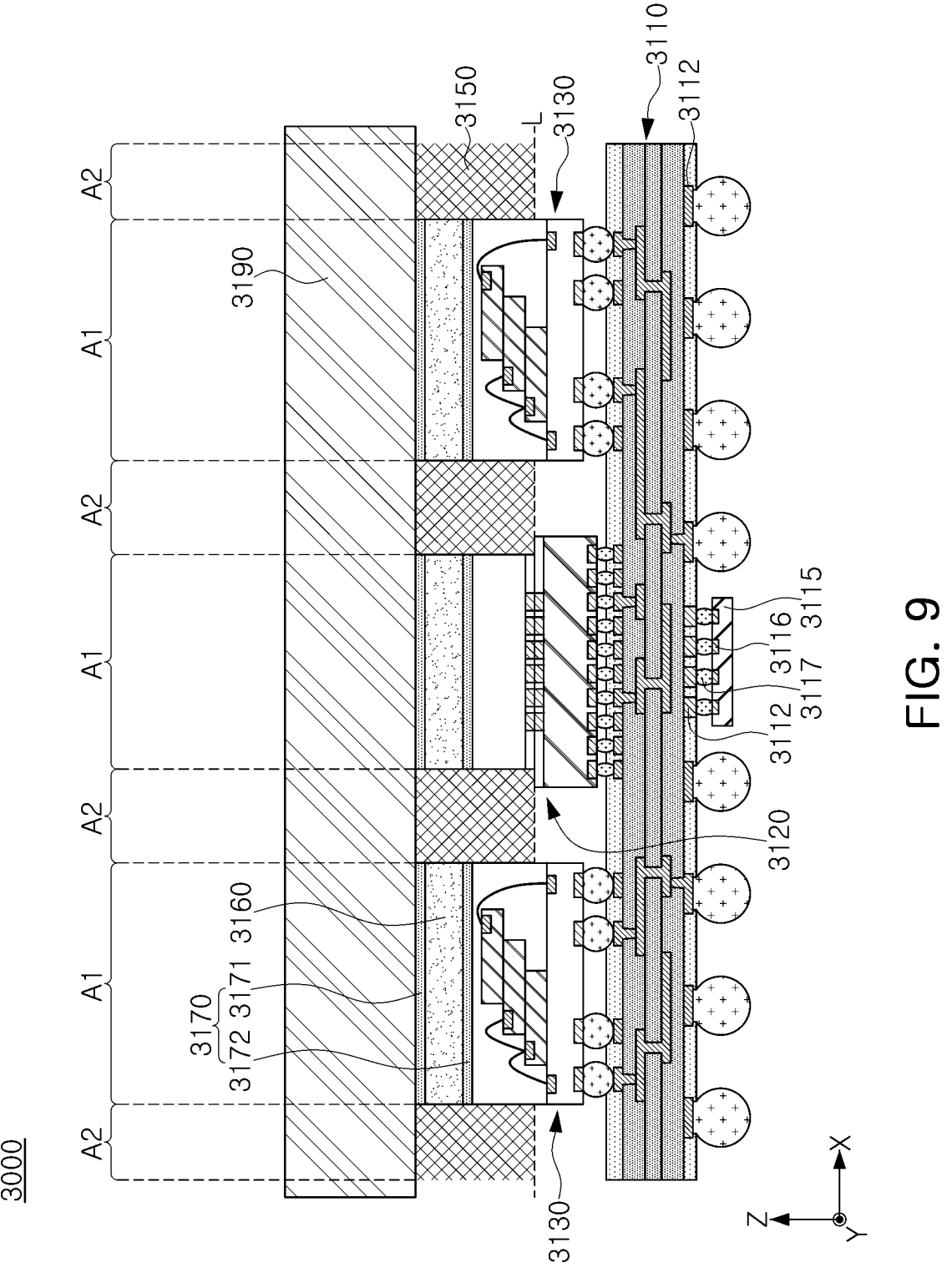

Referring to FIG. 9, in a semiconductor package 3000 according to an example embodiment, includes two second semiconductor chips 3130, and a bonding enhancing layer 3170, and a thermal interface material layer 3160 in a plurality of first regions A1. A porous barrier structure 3150 may be in a second region A2 that does not extend into a first region A1.

The semiconductor package 3000 according to an example embodiment may be understood as having characteristics the same as or similar to those of the semiconductor package 2000 described above with reference to FIG. 8, except that the bonding enhancing layer 3170 and the thermal interface material layer 3160 are respectively on the first semiconductor chip 3120 and the second semiconductor chip 3130, an encapsulant is omitted, and the porous barrier structure 3150 covers the side surfaces of the first semiconductor chip 3120 and the second semiconductor chip 3130.

The semiconductor package 3000 may include a package substrate 3110, first and second semiconductor chips 3120 and 3130, a porous barrier structure 3150, a thermal interface material layer 3160, a bonding enhancing layer 3170, and a heat dissipation member 3190. The bonding enhancing layer 3170 may include a first bonding enhancing layer 3171 and a second bonding enhancing layer 3172 respectively on lower and upper surfaces of the thermal interface material layer 3160.

A lower pad 3112 may be on a lower surface of the package substrate 3110, and a passive element 3115 may be mounted on the lower pad 3112. A connection pad 3116 of the passive element 3115 may be electrically connected to the lower pad 3112 through a solder bump 3117.

The porous barrier structure 3150 may be supported by the first semiconductor chip 3120. For example, when the first semiconductor chip 3120 is a semiconductor chip stack in which a plurality of semiconductor chips are stacked, the porous barrier structure 3150 may be supported on an upper surface of any one of the first semiconductor chips 3120. According to an embodiment, a level L of a lower surface of the porous barrier structure 3150 may be located on a level higher than that of an upper surface of the package substrate 3110, and the lower surface of the porous barrier structure 3150 and the upper surface of the package substrate 3110 may be spaced apart from each other.

Figure 10:
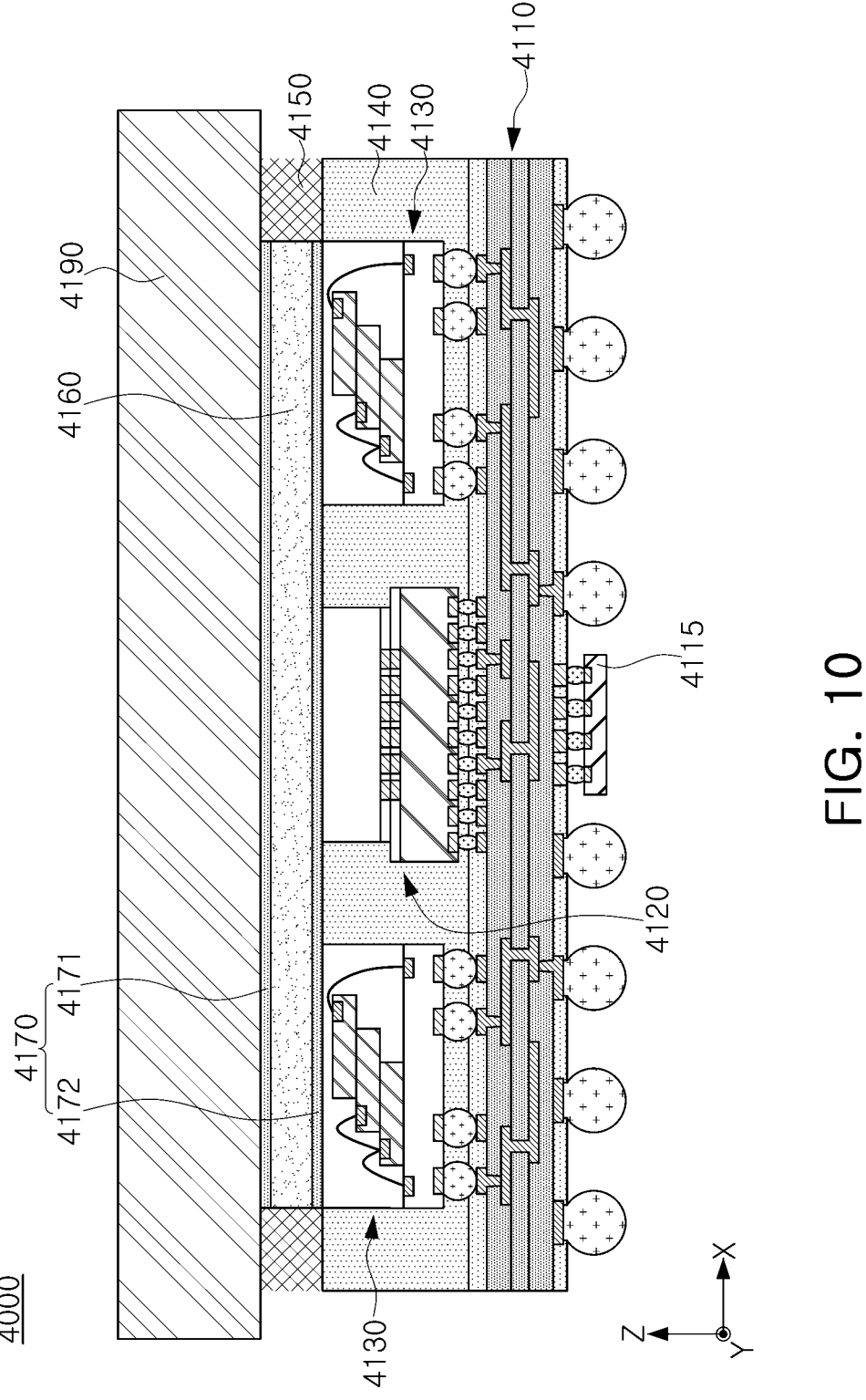

Referring to FIG. 10, a semiconductor package 4000 according to an example embodiment may be understood as having characteristics the same as or similar to those of the semiconductor package 2000 described above with reference to FIG. 8, except that two second semiconductor chips 4130 are provided and a passive element 4115 is mounted on a lower surface of a package substrate 4110.

The semiconductor package 4000 may include a package substrate 4110, first and second semiconductor chips 4120 and 4130, an encapsulant 4140, a porous barrier structure 4150, a thermal interface material layer 4160, a bonding enhancing layer 4170, and a heat dissipation member 4190. The bonding enhancing layer 3170 may include a first bonding enhancing layer 4171 and a second bonding enhancing layer 4172 respectively on lower and upper surfaces of the thermal interface material layer 4160.

According to embodiments of the present inventive concept, a semiconductor package in which a porous barrier structure and a thermal interface material layer formed of a liquid metal are employed to improve heat generation efficiency and a thermal interface material layer between a semiconductor chip and a heat generating portion may be rapidly discharged may be provided.

While example embodiments have been shown and described above, it will be apparent to those skilled in the art that modifications and variations could be made without departing from the scope of the present inventive concept as defined by the appended claims.

What is claimed is:

1. A semiconductor package comprising:
a package substrate;
a semiconductor chip on the package substrate and having a first surface facing the package substrate and a second surface, opposite to the first surface;
an encapsulant on the package substrate and on a side surface of the semiconductor chip;
a heat dissipation member on the semiconductor chip and spaced apart from the semiconductor chip;
a bonding enhancing layer on the second surface of the semiconductor chip;
a thermal interface material layer on the bonding enhancing layer and in a gap between the bonding enhancing layer and the heat dissipation member, wherein the thermal interface material layer comprises a liquid metal; and
a porous barrier structure on side surfaces of the bonding enhancing layer and the thermal interface material layer,
wherein the porous barrier structure is formed of a metal material and surrounds side surfaces of the bonding enhancing layer and the thermal interface material layer.

2. The semiconductor package of claim 1, wherein the liquid metal comprises an alloy including gallium, indium, and tin.

3. The semiconductor package of claim 2, wherein the bonding enhancing layer comprises at least one of gallium, tin, and copper.

4. The semiconductor package of claim 1, wherein the porous barrier structure comprises at least one of copper and nickel.

5. The semiconductor package of claim 1, further comprising an adhesive layer between the bonding enhancing layer and the semiconductor chip,
wherein the adhesive layer comprises at least one of gold, platinum, and iridium.

6. The semiconductor package of claim 1, wherein the bonding enhancing layer is on opposing sides of the thermal interface material layer.

7. The semiconductor package of claim 1, wherein the porous barrier structure is a porous structure having air permeability.

8. A semiconductor package comprising:
a package substrate;
a semiconductor chip on the package substrate;
a bonding enhancing layer on an upper portion of the semiconductor chip;
a heat dissipation member on the semiconductor chip and spaced apart from the semiconductor chip;
a thermal interface material layer on the bonding enhancing layer and in a gap between the semiconductor chip and the heat dissipation member, wherein the thermal interface material layer comprises a liquid metal; and
a porous barrier structure on side surfaces of the bonding enhancing layer and the thermal interface material layer, wherein the porous barrier structure comprises a metal material and air permeable pores and surrounds the side surfaces of the bonding enhancing layer and the thermal interface material layer,
wherein the thermal interface material layer does not extend into the air permeable pores of the porous barrier structure.

9. The semiconductor package of claim 8, wherein the bonding enhancing layer contacts an upper surface of the semiconductor chip.

10. The semiconductor package of claim 8, further comprising an encapsulant on the package substrate and on a side surface of the semiconductor chip.

11. The semiconductor package of claim 10, wherein the encapsulant is on an upper surface of the semiconductor chip.

12. The semiconductor package of claim 11, wherein the bonding enhancing layer contacts an upper surface of the encapsulant.

13. The semiconductor package of claim 8, wherein
the semiconductor chip comprises a plurality of semiconductor chips, and
upper surfaces of each of the plurality of semiconductor chips are at substantially a same level.

14. A semiconductor package comprising:
a package substrate;
a semiconductor chip on the package substrate;
a heat dissipation member on the semiconductor chip and spaced apart from the semiconductor chip;
a bonding enhancing layer on the semiconductor chip;
a thermal interface material layer in a gap between the semiconductor chip and the bonding enhancing layer, the thermal interface material layer comprising a liquid metal; and
a porous barrier structure comprising a metal material on side surfaces of the bonding enhancing layer and the thermal interface material layer,
wherein the porous barrier structure surrounds the side surfaces of the bonding enhancing layer and the thermal interface material layer.

15. The semiconductor package of claim 14, further comprising an encapsulant on the package substrate and on a side surface of the semiconductor chip.

16. The semiconductor package of claim 14, wherein the porous barrier structure is on a side surface of the semiconductor chip.

17. The semiconductor package of claim 14, wherein
the porous barrier structure comprises at least one of copper and nickel, and
the bonding enhancing layer comprises at least one of gallium, tin, and copper.

18. The semiconductor package of claim 17, further comprising a coating on a surface of the porous barrier structure comprising at least one of gallium, indium, and tin.

19. The semiconductor package of claim 14, further comprising an adhesive layer between the bonding enhancing layer and the semiconductor chip,
wherein the adhesive layer comprises at least one of gold, platinum, and iridium.

20. The semiconductor package of claim 19, further comprising a barrier layer between the bonding enhancing layer and the thermal interface material layer,
wherein the barrier layer includes at least one of stainless steel, gold, platinum, and nickel.

* * * * *